(12) United States Patent
Boulenc

(10) Patent No.: US 9,257,526 B2
(45) Date of Patent: Feb. 9, 2016

(54) METHOD FOR MANUFACTURING A VERTICAL BIPOLAR TRANSISTOR COMPATIBLE WITH CMOS MANUFACTURING METHODS

(71) Applicant: STMicroelectronics SA, Montrouge (FR)

(72) Inventor: Pierre Boulenc, Saint Pierre d'Allevard (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/313,836

(22) Filed: Jun. 24, 2014

(65) Prior Publication Data
US 2014/0374792 A1 Dec. 25, 2014

(30) Foreign Application Priority Data

Jun. 24, 2013 (FR) .................................... 13 56023

(51) Int. Cl.
*H01L 29/66* (2006.01)
*H01L 21/8249* (2006.01)
(Continued)

(52) U.S. Cl.
CPC ...... *H01L 29/66333* (2013.01); *H01L 21/8249* (2013.01); *H01L 29/0692* (2013.01); *H01L 29/66272* (2013.01); *H01L 29/7325* (2013.01); *H01L 29/7395* (2013.01); *H01L 29/0821* (2013.01)

(58) Field of Classification Search
CPC ...................... H01L 29/66333; H01L 29/7395; H01L 29/7325; H01L 29/66272; H01L 29/0692; H01L 21/8249

USPC ........................... 438/372, 377; 257/574, 575
See application file for complete search history.

(56) References Cited

U.S. PATENT DOCUMENTS

| 4,727,046 A | 2/1988 | Tuntasood et al. |
| 5,656,514 A * | 8/1997 | Ahlgren ............ H01L 29/66242 257/197 |

(Continued)

FOREIGN PATENT DOCUMENTS

JP      2009-295654 A      12/2009

OTHER PUBLICATIONS

Cai et al., "Complementary Thin-Base Symmetric Lateral Bipolar Transistors on SOI," IEEE International Electron Devices Meeting (IEDM), Dec. 5-7, 2011, Washington, DC, pp. 16.3.1-16.3.4.
(Continued)

*Primary Examiner* — John P Dulka
(74) *Attorney, Agent, or Firm* — Seed IP Law Group PLLC

(57) ABSTRACT

The present disclosure relates to a method for manufacturing a bipolar transistor. The method forms a trench to isolate a first region from a second region in a semiconductor wafer, and to isolate these regions from the rest of the wafer. The method forms first P-doped well in the second region and produces a collector region of second and third wells by a P doping in the first region. The second well is in contact with the first well below the trench. The method also produces an N-doped base well on the collector region and, at the wafer surface, and forms a CMOS transistor gate on the first region and delimiting a third region and a fourth region. The method also forms a P+-doped collector contact region in the first well, forms a P+ doped emitter region in the third region, and forms an N+-doped base contact region in the fourth region.

13 Claims, 5 Drawing Sheets

(51) Int. Cl.
*H01L 29/732* (2006.01)
*H01L 29/06* (2006.01)
*H01L 29/739* (2006.01)
*H01L 29/08* (2006.01)

(56) References Cited

U.S. PATENT DOCUMENTS

| | | | | | |
|---|---|---|---|---|---|
| 6,350,640 | B1 * | 2/2002 | Fuller | | H01L 27/0623 257/E27.015 |
| 7,701,038 | B2 * | 4/2010 | Chen | | H01L 21/8224 257/197 |
| 8,115,280 | B2 * | 2/2012 | Chen | | H01L 29/735 257/197 |
| 8,324,713 | B2 * | 12/2012 | Chen | | H01L 21/8224 257/197 |
| 8,674,454 | B2 * | 3/2014 | Ko | | H01L 21/8249 257/370 |
| 8,963,199 | B2 * | 2/2015 | Kubo | | H01L 29/0653 257/139 |
| 2004/0051148 | A1 * | 3/2004 | Johnson et al. | | 257/378 |
| 2006/0043528 | A1 * | 3/2006 | Ren | | H01L 21/8249 257/565 |
| 2009/0294798 | A1 * | 12/2009 | Chung | | H01L 27/0207 257/133 |
| 2010/0213575 | A1 * | 8/2010 | Chen et al. | | 257/575 |
| 2013/0299944 | A1 * | 11/2013 | Lai | | H01L 29/66166 257/586 |
| 2014/0042592 | A1 * | 2/2014 | Toner | | H01L 29/402 257/585 |

OTHER PUBLICATIONS

Chai et al., "A New Self-Aligned Bipolar Transistor Using Vertical Nitride Mask," International Electron Devices Meeting (IEDM), vol. 31, pp. 26-29, 1985, 5 pages.

Chen et al., "A Low-Flicker Noise Gate-Controlled Lateral-Vertical Bipolar Junction Transistor Array With 55-nm CMOS Technology," *IEEE Transactions on Electron Devices* 58(10):3276-3282, Oct. 2011.

Feng et al., "Gate Controlled Vertical-Lateral NPN Bipolar Transistor in 90nm RF CMOS Process," IEEE Bipolar/BiCMOS Circuits and Technology Meeting, Oct. 13-15, 2008, Monteray, CA, pp. 29-32.

O et al., "BiMOS Transistors: Merged Bipolar/Sidewall MOS Transistors," *IEEE Electron Device Letters* 10(11):517-519, Nov. 1989.

Sadamatsu et al., "New Self-Aligned Complementary Bipolar Transistors Using Selective-Oxidation Mask," International Electron Devices Meeting (IEDM), vol. 30, pp. 753-756, 1984.

* cited by examiner

METHOD FOR MANUFACTURING A VERTICAL BIPOLAR TRANSISTOR COMPATIBLE WITH CMOS MANUFACTURING METHODS

BACKGROUND

1. Technical Field

The present disclosure relates to the manufacturing of integrated circuits on a semiconductor wafer, and more particularly to a method for manufacturing a bipolar transistor compatible with CMOS (Complementary Metal Oxide Semiconductor) manufacturing methods.

2. Description of the Related Art

Generally, the formation of vertical bipolar transistors in a CMOS circuit employs a significant number of resists and additional manufacturing steps. These additional steps relate in particular to forming doped zones to produce the emitter, the base and the collector of the bipolar transistor at different depths in the semiconductor wafer. These steps are generally not useful to form CMOS transistors that are usually produced on the surface of the wafer.

Certain techniques of forming a bipolar transistor use the formation of isolated wells that are produced for the CMOS transistors. The bipolar transistors obtained using these techniques generally have insufficient performances, in particular in terms of gain and frequency resistance, for most applications. The steps of forming these wells are indeed optimized for the formation of CMOS transistors, but not for the formation of bipolar transistors.

One well-known method also involves producing in CMOS circuits bipolar transistors which can achieve a higher gain, in the order of 100, and a frequency resistance of a few tens of GHz. FIG. 1 thus represents a cross-section of an example of a PNP-type bipolar transistor formed in a semiconductor wafer. The bipolar transistor comprises a base BW formed by an N-doped well, an N-doped isolating well NISO, produced deep down, and a collector produced by several layers of different types of doping, formed between the base well BW and the isolating well. In this example, the collector comprises a P+-doped well PPW, formed above the well NISO, and another P-doped well PW, formed between the wells PPW and BW. The emitter of the bipolar transistor is formed by a P-doped layer of polysilicon ET, deposited on the base well BW. The sides of the emitter ET are protected by isolating spacers SP. A base contact is produced by an N+-doped zone BD formed in the base well BW around the emitter ET, and topped by a connecting metal layer. A collector contact CPD is formed by a P+-doped region, isolated from the base well BW by means of an isolating trench STI. The collector contact CPD is formed in a P-doped well CLW, ensuring the electrical link between the collector contact CPD and the well PPW. The well NISO is biased by means of a well contact formed by an N+-doped zone SPD, electrically linked to the layer NISO by two N+-doped wells SLW and SNW.

Unlike CMOS transistors, the manufacturing of this transistor forms a significant number of doped wells, and thus employs a large number of resists and doping steps. In addition, this transistor also occupies a significant wafer surface area.

BRIEF SUMMARY

One embodiment of the present disclosure is a bipolar transistor having high performances, in particular in terms of gain and frequency resistance. The bipolar transistor can be made with a reduced number of resists and a reduced number of manufacturing steps to be added to the steps of manufacturing CMOS transistors on a semiconductor wafer.

Some embodiments relate to a method for manufacturing a bipolar transistor, the method comprising steps of: forming at least one isolating trench to isolate a first region from a second region in a semiconductor wafer, and to isolate the first and second regions from the rest of the wafer, forming a first well by means of a first type of doping, in the second region, producing a collector region by forming a second well by means of the first type of doping, in the first region, the second well being in contact with the first well below the isolating trench, producing a base region by forming a third well by means of a second type of doping above the second well on the wafer surface, forming a CMOS transistor gate on the first region to delimit with the isolating trench a first region and a second region, forming a collector contact region and an emitter region by means of heavy doping of the first type, respectively in the first well and in the first region, and forming a base contact region by means of heavy doping of the second type, in the second region.

According to one embodiment, the wafer has the first type of doping, the method comprising a step of forming an isolating well by means of the second type of doping deep in the wafer, below the first and second wells.

According to one embodiment, the isolating well is formed during steps of forming a CMOS circuit in the wafer.

According to one embodiment, the method comprises the formation of a first and of a second isolating trench, the first trench surrounding the first region, and the second trench surrounding the collector contact region and the first trench.

According to one embodiment, the isolating trenches, the first well, the gate, and the heavily doped regions are produced during steps of forming a CMOS circuit in the wafer.

According to one embodiment, the second and third wells are produced using a same resist.

According to one embodiment, the second well is more heavily doped deep down than close to the surface of the wafer.

According to one embodiment, the first well is more heavily doped on the surface of, than deep down in the wafer.

Some embodiments also relate to a bipolar transistor which can be integrated into a CMOS-type integrated circuit structure, the transistor comprising: at least one isolating trench isolating a first region from a second region in a semiconductor wafer, and isolating the first and second regions from the rest of the wafer, a first well having a first type of doping, formed in the second region, a collector region formed by a second well having the first type of doping, in the first region and in contact with the first well below the isolating trench, a base region formed by a third well having a second type of doping, in the second well on the surface of the wafer, a CMOS transistor gate formed on the first region, delimiting with the isolating trench a first region and a second region, a collector contact region and an emitter region having heavy doping of the first type, respectively in the first well and in the first region, and a base contact region having heavy doping of the second type in the second region.

According to one embodiment, the bipolar transistor comprises a first and a second isolating trench, the first trench surrounding the first region, and the second trench surrounding the collector contact region and the first trench.

According to one embodiment, the gate surrounds the emitter region, and the base contact region surrounds the gate.

According to one embodiment, the emitter region, the gate and the base contact region are aligned and surrounded by the first isolating trench.

According to one embodiment, the emitter region, the gate, the base contact region and the collector contact region are aligned and surrounded by the isolating trench which isolates the base contact region from the collector contact region.

BRIEF DESCRIPTION OF THE SEVERAL VIEWS OF THE DRAWINGS

Some examples of embodiments of the present disclosure will be described below in relation with, but not limited to, the following figures, in which.

DETAILED DESCRIPTION

Figure 1:
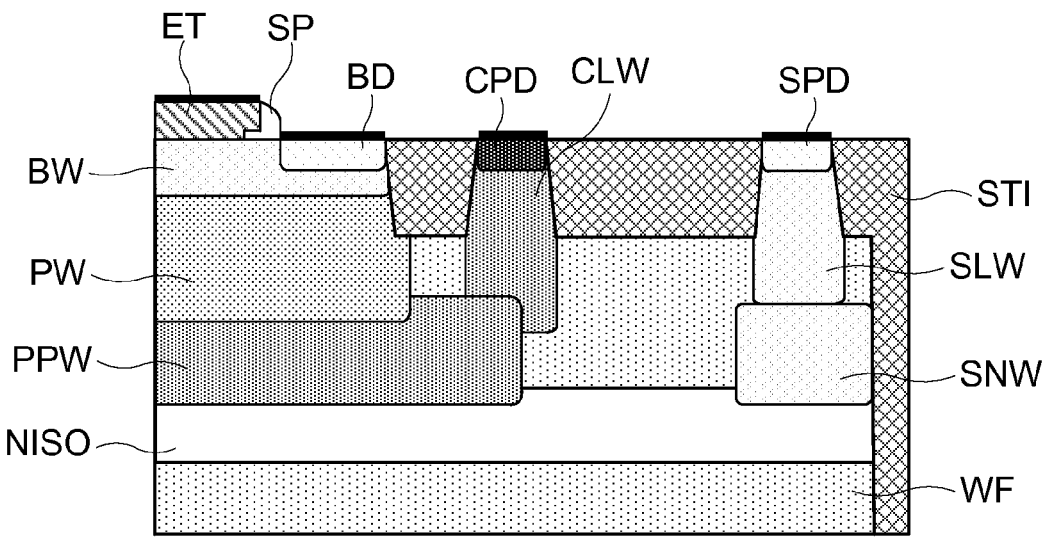
FIG. 1 described above, schematically represents a cross-section of a bipolar transistor, according to prior art, FIGS. 2 to 6 schematically represent a cross-section of a semiconductor wafer at different steps of manufacturing a PNP-type bipolar transistor, according to one embodiment, FIG. 7 schematically represents a cross-section of a semiconductor wafer comprising an NPN-type bipolar transistor, according to one embodiment.
Figure 2:
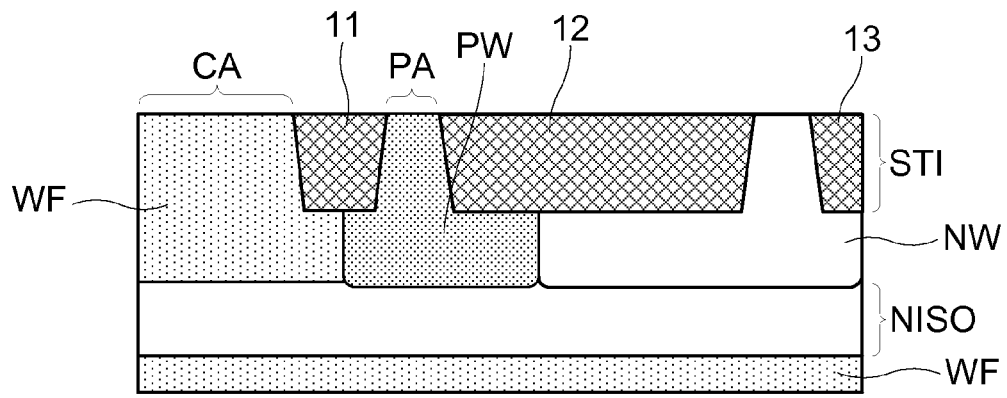

FIGS. 2 to 6 represent an integrated circuit on a semiconductor wafer WF, at different steps of a method for manufacturing a PNP-type bipolar transistor, according to one embodiment. The wafer WF may be made of P-doped silicon. FIG. 2 shows some first steps of the manufacturing method. These steps including forming isolating trenches STI in the wafer WF by shallow trench isolating (STI) techniques, forming an embedded isolating well NISO deep down in the wafer WF, and forming N- and P-doped wells NW, PW between the upper surface of the wafer WF and the well NISO.

The trenches STI comprise a trench 11 enabling a first region CA to be isolated from a second region PA. In some embodiments, the first region CA is a central region positioned centrally in the wafer WF and the second region PA is a peripheral region positioned peripherally in the wafer. The trenches STI also comprise a trench 12 enabling the first CA and second PA regions to be isolated from the rest of the wafer WF, and in particular from a bias contact of the well NISO (described below). The trenches 11, 12 can be produced by classic means, for example by etching a layer of light-sensitive resin through a resist, and by plasma etching through the layer of resin. The trenches are then filled with an electrically insulating material such as silicon oxide, the layer of oxide then being planarized by mechanical or chemical polishing, to leave the insulating material in the trenches only.

The embedded well NISO can be produced by ion implantation or by diffusion of an appropriate doping material. The regions of the wafer WF where the well NISO is not desired to be formed are protected by an etched layer of light-sensitive resin.

The wells PW and NW extend between the layer NISO and the upper surface of the wafer WF. The well PW is made in the second region PA between the trenches 11 and 12 and below a portion of the trenches 11, 12 to form a collector contact. The well NW is formed between the trench 12 and a trench 13 of the trenches STI and below a portion of the trenches 12, 13. The well NW is provided to electrically link the layer NISO to a bias contact of the layer NISO formed on the surface of the wafer WF between the trenches 12 and 13. The wells PW and NW may be in contact with each other below the trench 12. Each of the wells PW and NW can be produced by ion implantation or diffusion of an appropriate doping material through a layer of light-sensitive resin previously etched to only leave exposed the regions to be doped.

Figure 3:
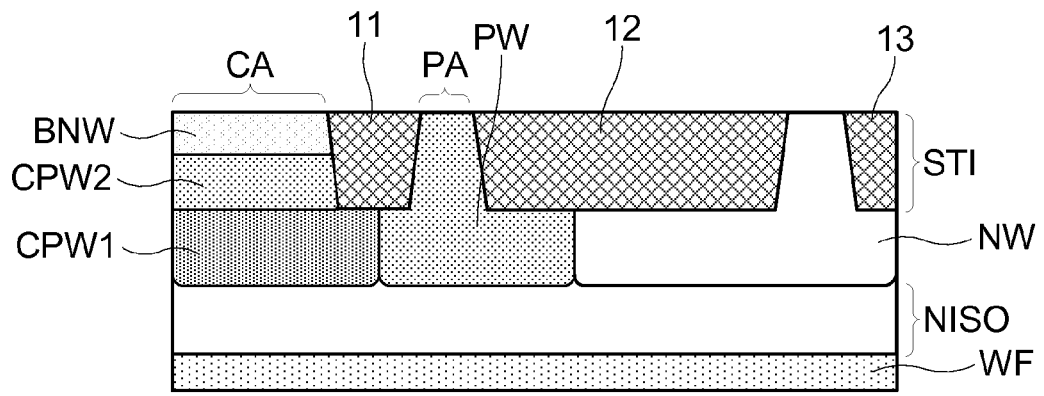

FIG. 3 shows some next steps of the manufacturing method. These steps involve successively forming in the first region CA delimited by the trench 11, P-doped collector wells CPW1, CPW2, and an N-doped base well BNW, to form collector and base regions of the bipolar transistor. The well CPW1 reaches the well NISO and the well PW below the trench 11. The well CPW2 is formed above the well CPW1 and laterally limited by the trench 11. The well PW thus ensures an electrical link between the collector formed by the wells CPW1, CPW2, and the surface of the wafer between the trenches 11 and 12. The doping of the well CPW2 is less concentrated than the well CPW1.

The well BNW is formed between the well CPW2 and the upper surface of the wafer. The wells CPW1, CPW2 and BNW can be formed by ion implantation or diffusion of an appropriate doping material through a layer of light-sensitive resin previously etched using a same resist to only leave exposed the regions to be doped. In FIG. 3, the resist does not cover the first region CA and a portion of the trench 11 adjacent to the region CA.

It shall be noted that the layer NISO enables the wells PW and CPW1 to be electrically insulated from the rest of the wafer WF that has the same type of doping as the wells.

Figure 4:
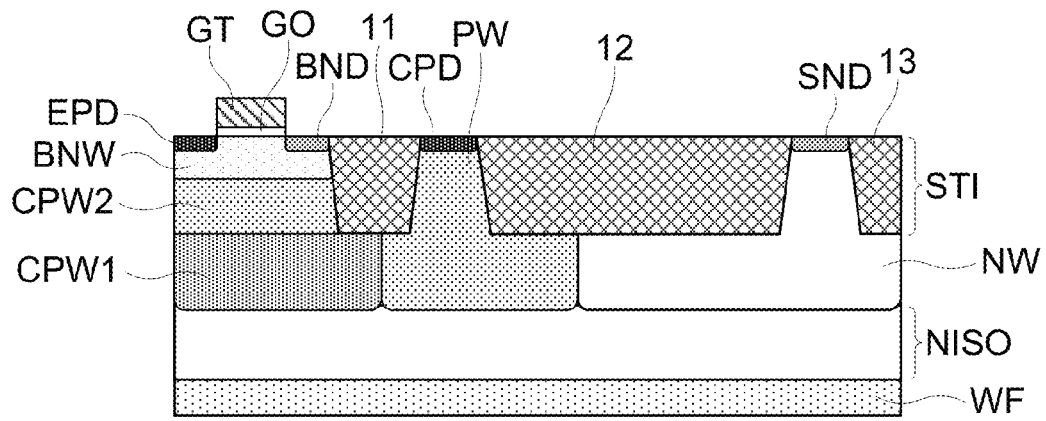

FIG. 4 shows some next steps of the method. These steps involve forming a gate GT on the base well BNW, forming heavily P+-doped emitter EPD and collector contact CPD regions, and forming heavily N+-doped base contact BND and bias contact SND regions of the well NISO.

The emitter EPD and base contact regions BND are formed at opposite sides of the gate GT, on the surface of the wafer WF in the first region CA delimited by the trench 11. The gate GT can be produced in a classic manner by forming on the surface of the wafer WF a layer of oxide GO, and by depositing and by etching a layer of polysilicon on the wafer WF. The layer GO can be produced by thermal oxidation of a thin surface layer of the wafer WF. The layer of polysilicon can be etched through a resist deposited and etched on this layer.

The regions EPD, CPD can be produced simultaneously by ion implantation or diffusion of an appropriate doping material through a layer of light-sensitive resin previously etched to only leave exposed the regions to be doped. The regions BND, SND are produced simultaneously in a similar manner, using another appropriate doping material. It shall be noted that the gate GT and the trenches 11, 12 enable the regions EPD and BND, and the regions CPD and SND to be separated, and any resist misalignment to be prevented when forming the latter.

Figure 5:
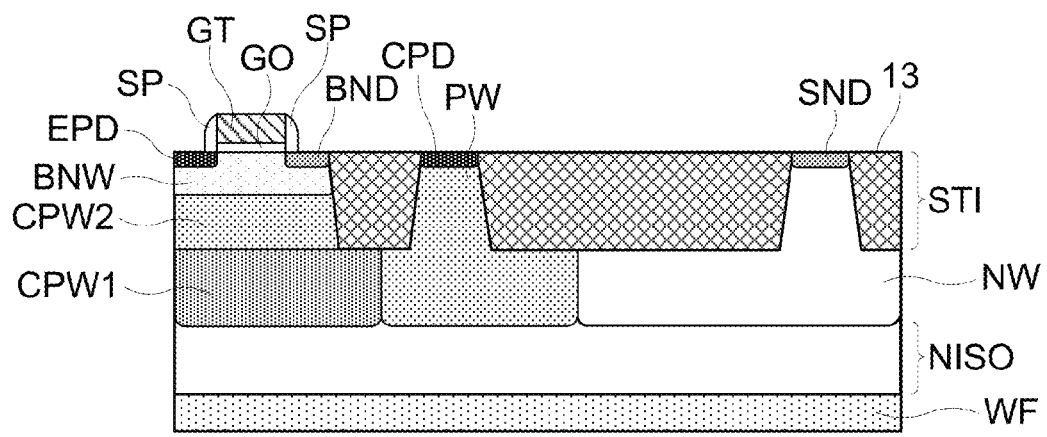

FIG. 5 shows some next steps of the method. These steps involve forming a lateral wall spacer SP around the gate GT. The spacer SP is classically formed by depositing on the wafer WF a layer made of an insulating material such as silicon oxide or silicon nitride, and by plasma anisotropic etching of the insulating layer.

Figure 6:
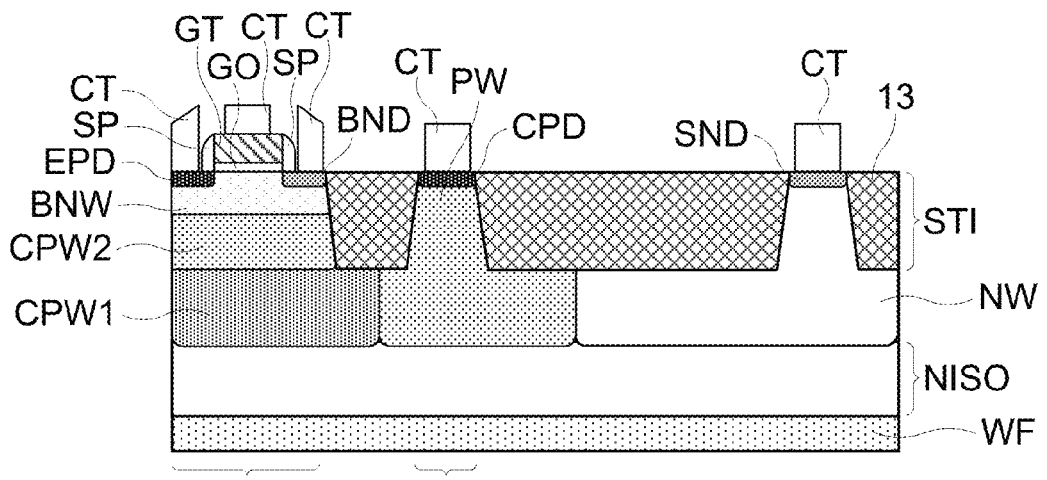

FIG. 6 shows a next step of the method involving forming contacts CT on the doped regions EPD, BND, CPD, SND and on the gate GT, so as to enable these regions to be connected to the rest of a circuit formed in the wafer WF.

It shall be noted that the layer NISO is generally used to form CMOS transistors, and in particular to isolate from the rest of the wafer the wells PW used to form n-channel CMOS transistors. Furthermore, the trenches STI, the wells PW, NW, the doped regions EPD, BND, CPD and SND on the surface of the wafer, and the gate GT, can be formed at the same time as those used to form the CMOS transistors. The result is that to produce bipolar transistors in a CMOS circuit, only the steps of forming wells CPW1, CPW2 and BNW are added to the manufacturing method. The steps to be added thus involve only one additional photolithography resist and comprise steps of depositing and etching a layer of light-sensitive resin through the additional resist, and of forming three different types of doping through the layer of resin thus etched.

Figure 7:
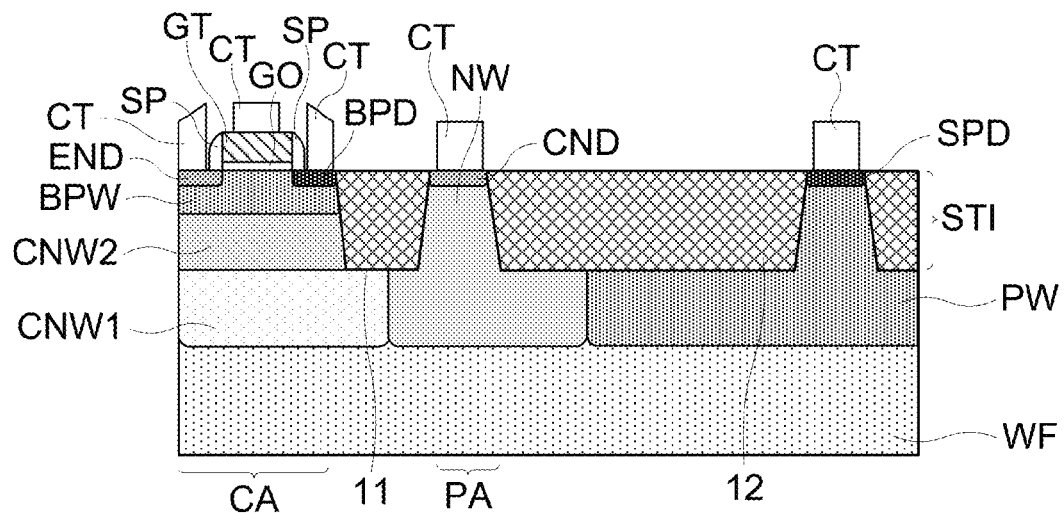

FIG. 7 represents an NPN-type bipolar transistor, according to one embodiment. The bipolar transistor in FIG. 7 differs from the one represented in FIG. 6 in that the doping of the different regions forming the transistor are inverted between the P and N types. Here, the layer NISO is not present due to the fact that the wells CNW1 and NW have a different type of doping from that of the P-type wafer, and are thus already isolated from the wafer. The bias contact SND of the well NISO is thus replaced by a bias contact SPD of the wafer WF. More precisely, the transistor in FIG. 7 comprises:

N-doped wells CNW1, CNW2, forming a collector region above the layer NISO, in the first region CA isolated by the trench 11, a gate GT formed on the first region CA, a P-doped well BPW, forming a base region in the first region CA, and between the well CNW2 and the upper surface of the wafer WF, with a P+-doped base contact region BPD on one side of the gate GT, and N+-doped emitter END and collector contact CND regions formed respectively in the base region of another side of the gate GT, and between the trenches 11 and 12.

It shall be noted that, by adjusting the bias voltage of the gate GT, it can be possible to change the gain of the transistor in FIG. 6 or 7.

Figure 8:
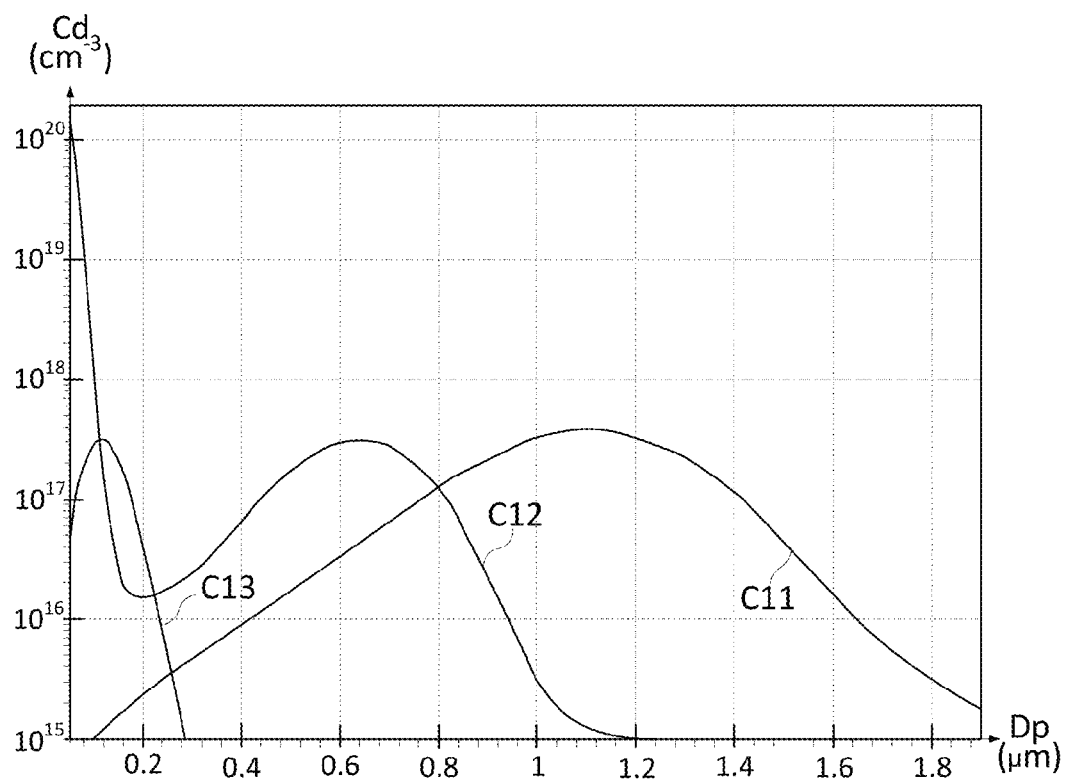
FIG. 8 represents curves of dopant concentration according to the depth in the wafer, FIGS. 9 to 11 schematically represent in a top view, the semiconductor wafer in which a bipolar transistor is formed, according to various embodiments.

FIG. 8 represents curves C11, C12, C13 of variation in the concentration of dopant Cd according to the depth Dp in the wafer of different regions of the bipolar transistor in FIG. 6, according to one example of an embodiment. The curve C11 corresponds to the doping of the well NISO which can be produced using phosphorus doping, the concentration Cd of which is situated between approximately 1 and $4 \cdot 10^{17}/cm^3$ at depths Dp situated between approximately 0.8 and 1.4 µm, where the maximum concentration is reached at approximately 1.1 µm.

The curve C12 corresponds to the regions EPD, CPW1 and CPW2 which can be produced using single boron doping. The region EPD is situated between the surface of the wafer WF and a depth of approximately 0.1 µm. The concentration of dopant in the region EPD decreases from approximately $10^{20}$ on the surface of the wafer, to approximately $10^{17}/cm^3$ at a depth of approximately 0.1 µm. The well CPW2 is substantially situated between the depths Dp of approximately 0.1 µm and 0.44 µm where the concentration of dopant Cd varies between approximately 1.5 and $10 \cdot 10^{16}/cm^3$, the minimum concentration value being reached at approximately 0.2 µm. The well CPW1 is substantially situated at depths Dp situated between approximately 0.44 and 0.8 µm where the concentration of dopant Cd varies between approximately 1 and $4 \cdot 10^{17}/cm^3$, the maximum concentration being reached at approximately 0.65 µm. The region EPD and the wells CPW1 and CPW2 can thus be produced with the same dopant by adjusting the concentration according to the depth in the wafer. The wells CPW1, CPW2 can be produced during a same step of doping using a same light-sensitive resin resist.

The curve C13 corresponds to the well BNW which can be produced using arsenic doping, the concentration Cd of which has a maximum value of approximately $3 \cdot 10^{17}/cm^3$ at a depth Dp situated at approximately 0.1 µm from the surface of the wafer WF. On the surface of the wafer and at a depth of approximately 0.2 µm, the concentration of dopant in the well BNW drops to approximately $5 \cdot 10^{16}/cm^3$. The region BND can be produced using the same dopant, with a concentration which can correspond to that of the region EPD between the surface of the wafer and the depth (at approximately 0.1 µm) where the concentration of dopant in the well BNW is maximum.

For the NPN transistor in FIG. 7, the curve C12 can correspond to the regions CNW1, CNW2 and END, and the curve C13 can correspond to the well BPW, by replacing the boron with phosphorus, and the arsenic with indium.

Figure 9:
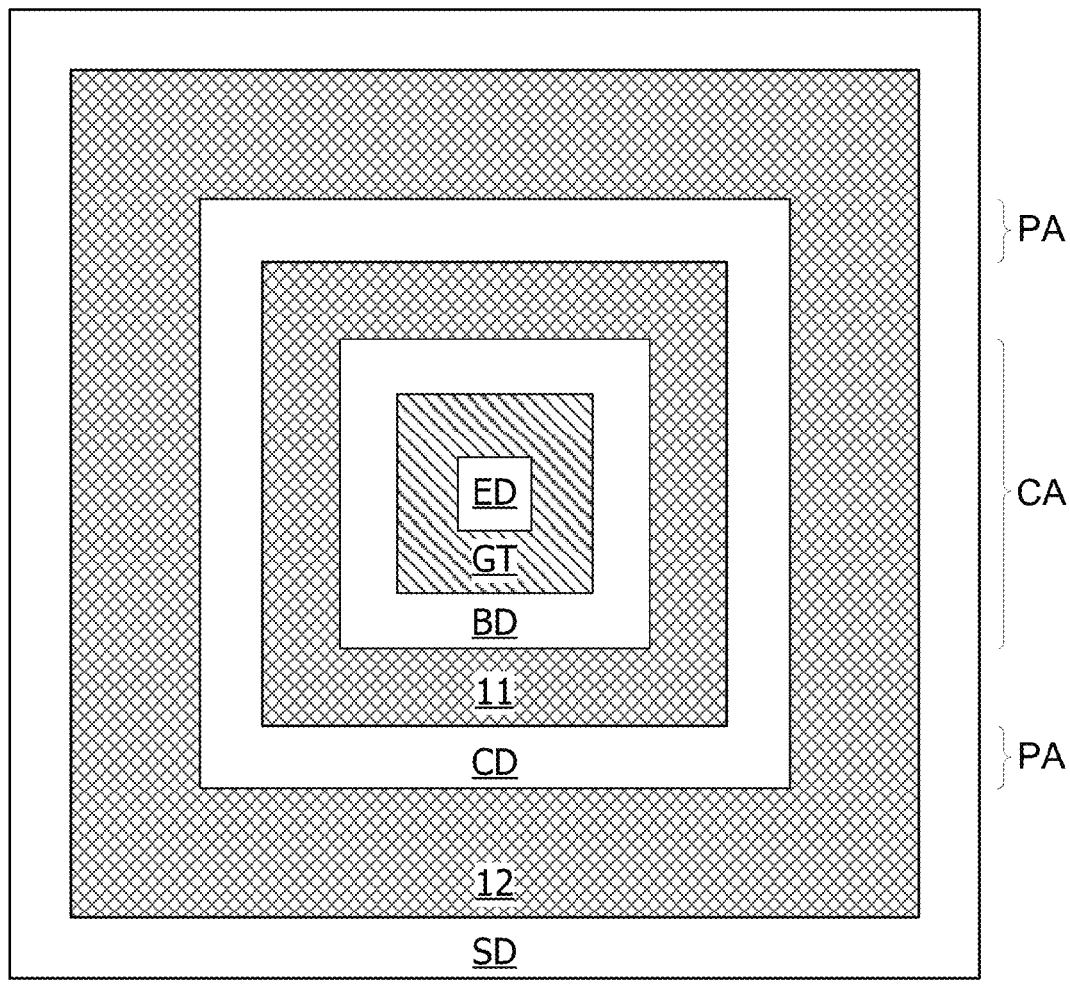

FIG. 9 represents in a top view the wafer WF in which the bipolar transistor is produced, according to one embodiment. The bipolar transistor has a concentric structure in which the first region CA is a central region surrounded by the peripheral, second region PA. This structure comprises, moving outwards from the center of the structure, the emitter region ED (EPD, END), the gate GT formed around the region ED, the base contact region BD (BND, SPD) formed around the gate GT, the trench 11 formed around the region BD, the collector contact region CD (CPD, CND) formed around the trench 11, the trench 12 formed around the region CD, and the bias contact region SD of the well NISO or of the wafer WF, formed around the trench 12. In the example in FIG. 9, the structure has a square or rectangular shape. This structure can alternatively be circular or elliptic in shape.

Figure 10:
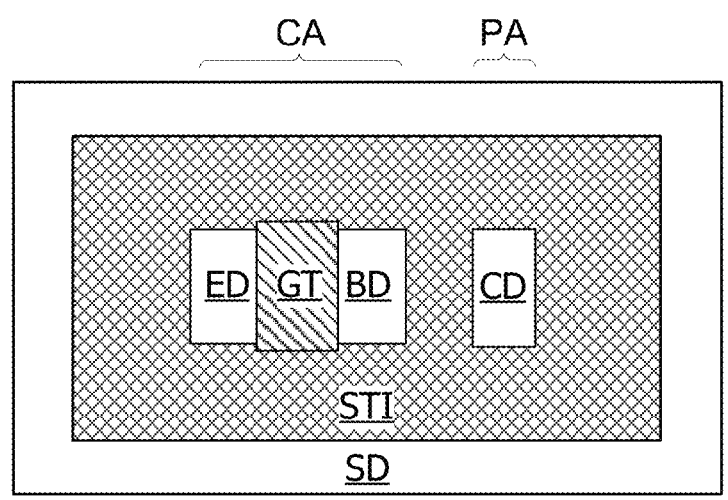

FIG. 10 represents in a top view the wafer WF in which the bipolar transistor is produced, according to another embodiment. The bipolar transistor in FIG. 10 differs from the one represented in FIG. 9 in that it has an elongated structure in which an isolating trench STI surrounds the first region CA and the second region PA, by passing between these two regions. The trench STI is surrounded by the bias contact region SD of the well NISO or of the wafer WF. In the first region CA, the emitter region ED, the gate GT and the base contact region BD are aligned and each have a rectangular shape. The second region in which the collector contact CD is formed is limited to a rectangle aligned with the first region and situated on the side of the base contact region BD.

Figure 11:
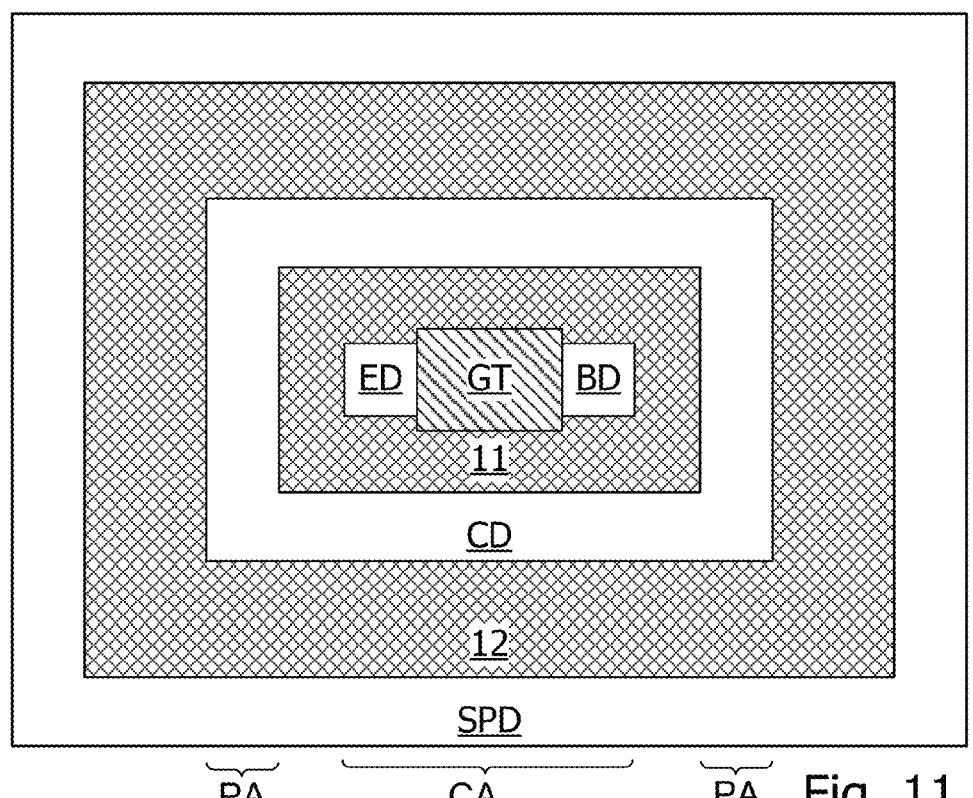

FIG. 11 represents in a top view the wafer WF in which the bipolar transistor is produced, according to another embodiment. The bipolar transistor in FIG. 11 differs from the one represented in FIG. 9 in that the first region CA has an elongated shape. In the first region CA, the emitter region ED, the gate GT and the base contact region BD are aligned and each have a rectangular shape.

It shall be noted that in the transistors in FIGS. 10 and 11, the gate GT can be wider than the emitter ED and base contact BD regions.

Figure 12:
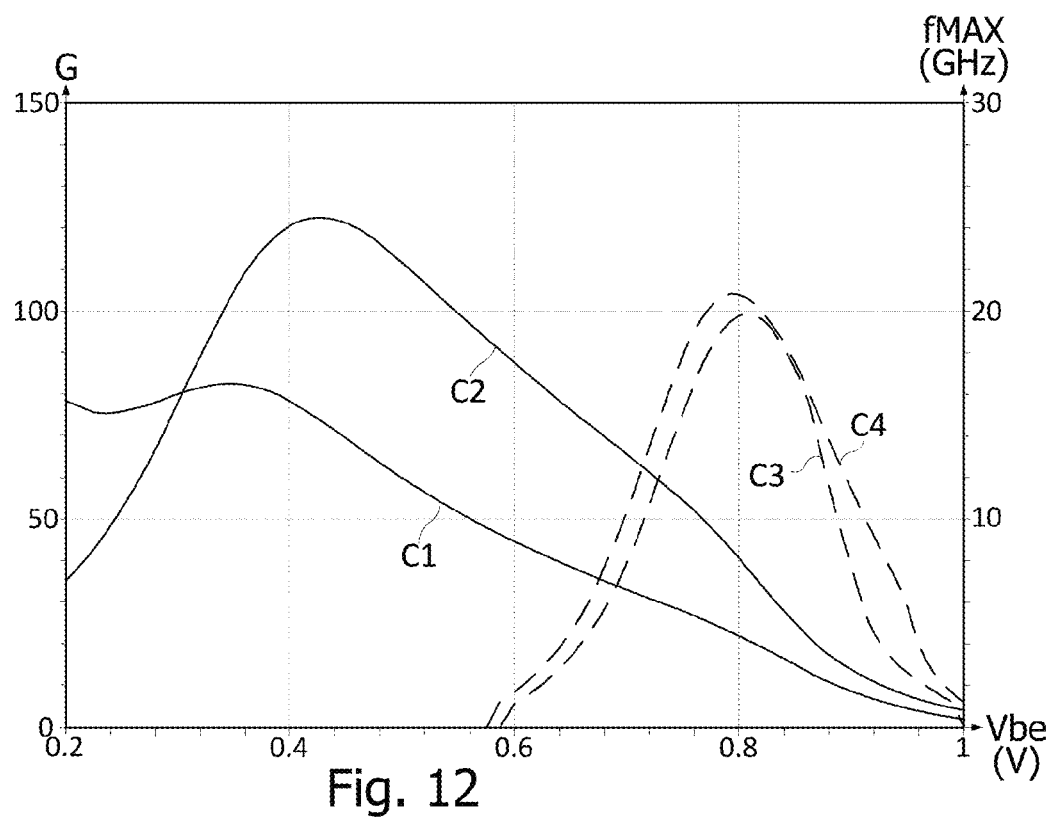
FIG. 12 represents curves showing the performances of the bipolar transistors in FIGS. 6 and 7.

FIG. 12 represents curves C1, C2 of variation in the gain G of transistors in FIGS. 6 and 7 according to the difference in potential Vbe applied between the base and the emitter of the transistors. According to the curve C1, the gain G of the PNP transistor (FIG. 6) reaches a maximum value in the vicinity of 80 when the voltage Vbe is situated between approximately 0.2 and 0.4V, and decreases to reach a value below 10 when the voltage Vbe is above 0.96V. According to the curve C2, the gain G of the NPN transistor (FIG. 7) reaches a maximum value in the vicinity of 120 when the voltage Vbe is situated between 0.4 and 0.5V, and decreases to reach a value below 10 when the voltage Vbe is above 0.96V.

FIG. 12 also represents curves C3, C4 of variation in the frequency resistance of the transistors in FIGS. 6 and 7 according to the difference in potential Vbe applied between the base and the emitter of the transistors. According to the curves C3, C4, the frequency resistance of the PNP and NPN transistors reaches a peak around 20 GHz in the vicinity of a voltage Vbe equal to 0.8V. On either side of this peak, the frequency rapidly decreases to reach a value below 2 GHz at the voltages Vbe below approximately 0.6V and above approximately 1V. It shall be noted that the curve C4 relating to the NPN transistor in FIG. 7 is slightly wider and higher (by approximately 1 GHz) than the curve C3, and its peak is situated at a value lower by approximately 0.2V.

It will be understood by those skilled in the art that the present disclosure is susceptible of various alternative embodiments and various applications. In particular, the present disclosure is not limited to the manufacturing of CMOS circuits, but can apply to the manufacturing of other types of integrated circuits.

Furthermore, it goes without saying that the present disclosure is not limited to the manufacturing of a bipolar transistor in a P-doped wafer. In the event that the wafer is N-doped, all the types of doping done in the structure in FIG. 6, including that of the wafer, can be inverted between the P and N types, to form an NPN-type bipolar transistor. Similarly, all the types of doping done in the structure in FIG. 7, including that of the wafer, can be inverted between the P and N types, to form a PNP-type bipolar transistor.

In addition, the portion of the circuit comprising the trench 13 and the well NW in FIG. 6 or the well PW in FIG. 7, does not belong to the actual bipolar transistor, and thus does not define the structure of the bipolar transistor.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming at least one isolating trench isolating a first region from a second region in a semiconductor wafer, and isolating the first and second regions from a remainder of the wafer;
   forming a first well by a first type of doping, in the second region;
   producing a collector region, wherein producing the collector region includes forming a second well by the first type of doping, in the first region, the second well being in contact with the first well below the at least one isolating trench, and forming a third well of the first type of doping above and contacting the second well;
   producing a base region by forming a fourth well by a second type of doping above the third well and at a surface of the wafer;
   forming a CMOS transistor gate on the first region;
   performing a doping of the first type, wherein performing the doping of the first type includes forming a collector contact region and an emitter region, respectively in the first well and in the base region adjacent to a first side of the gate; and
   forming a base contact region by a doping of the second type in the base region adjacent to a second side of the gate, wherein the third well and the base contact region are produced using a same resist.

2. The method according to claim 1, wherein the wafer has the first type of doping, the method comprising forming an isolating well by the second type of doping deep in the wafer and below the first and second wells.

3. The method according to claim 2, comprising forming a CMOS circuit in the wafer, wherein forming the isolating well includes forming the isolating well while forming the CMOS circuit in the wafer.

4. The method according to claim 1, wherein forming the at least one isolating trench includes forming first and second isolating trenches, the first isolating trench surrounding the first region, and the second trench surrounding the collector contact region and the first isolating trench.

5. The method according to claim 1, comprising forming a CMOS circuit in the wafer, wherein forming the at least one isolating trench, forming the first well, forming the gate, and forming the collector contact region and the emitter region are performed while forming the CMOS circuit in the wafer.

6. The method according to claim 1, wherein the second well is more heavily doped than the third well.

7. The method according to claim 1, wherein the first well is more heavily doped at the surface of the wafer than deep down in the wafer.

8. A bipolar transistor which can be integrated into a CMOS-type integrated circuit structure, the transistor comprising:
   at least one isolating trench isolating a first region from a second region in a semiconductor wafer, and isolating the first and second regions from the rest of the wafer;
   a first well having a first type of doping, formed in the second region;
   a collector region that includes a second well having the first type of doping, in the first region and in contact with the first well below the isolating trench, and a third well of the first type of doping above and contacting the second well;
   a base region formed by a fourth well having a second type of doping, above the third well and at a surface of the wafer;
   a CMOS transistor gate formed on the first region;
   a collector contact region and an emitter region having doping of the first type and positioned respectively in the first well and in the base region adjacent to a first side of the gate; and
   a base contact region, having doping of the second type, in the base region and adjacent to a second side of the gate, wherein:
   the at least one isolating trench includes a first and a second isolating trench, the first isolating trench surrounding the first region, and the second isolating trench surrounding the collector contact region and the first isolating trench; and
   the gate surrounds the emitter region, and the base contact region surrounds the gate.

9. The bipolar transistor according to claim 8, wherein the emitter region, the gate and the base contact region are aligned and surrounded by the at least one isolating trench.

10. The bipolar transistor according to claim 8, wherein the emitter region, the gate, the base contact region and the collector contact region are aligned and surrounded by the at least one isolating trench which isolates the base contact region from the collector contact region.

11. The bipolar transistor according to claim 8, wherein the wafer has the first type of doping, the bipolar transistor comprising an isolating well of the second type of doping deep in the wafer and below the first and second wells.

12. The bipolar transistor according to claim 8, wherein the second well is more heavily doped than the third well.

13. The bipolar transistor according to claim 8, wherein the first well is more heavily doped at the surface of the wafer than deep down in the wafer.

\* \* \* \* \*